United States Patent [19]

Bartholomay et al.

[11] Patent Number: 5,568,060
[45] Date of Patent: Oct. 22, 1996

[54] CIRCUIT BOARD INSERTION CIRCUITRY FOR HIGH RELIABILITY BACKPLANES

[75] Inventors: William G. Bartholomay, Orange; Eugene L. Parrella, Shelton; Daniel C. Upp, Southbury; Mikio S. Ichiba, Fairfield, all of Conn.

[73] Assignee: TranSwitch Corporation, Shelton, Conn.

[21] Appl. No.: 504,568

[22] Filed: Jul. 20, 1995

[51] Int. Cl.$^6$ .............................................. H03K 19/0185
[52] U.S. Cl. .............................................. 326/86; 326/57
[58] Field of Search .............................. 326/56, 57, 83, 326/86

[56] References Cited

U.S. PATENT DOCUMENTS

| | | | |
|---|---|---|---|
| 4,044,330 | 8/1977 | Johnson et al. | 326/56 |
| 4,912,346 | 3/1990 | Mizuta | 326/86 |
| 5,023,488 | 6/1991 | Gunning | 326/86 |
| 5,334,882 | 8/1994 | Ting | 326/86 |
| 5,408,146 | 4/1995 | Nguyen et al. | 326/86 |
| 5,485,107 | 1/1996 | Lacey et al. | 326/86 |

OTHER PUBLICATIONS

Berg Electronic's Assembly Specification for 2mm Connector part No. 70236-103, Jun. 8, 1994.

Primary Examiner—Edward P. Westin
Assistant Examiner—Benjamin D. Driscoll
Attorney, Agent, or Firm—David P. Gordon

[57] ABSTRACT

Circuit board insertion circuitry is used in conjunction with a staggered electrical connector. The insertion circuitry includes an isolated circuit which receives a high system voltage upon first stage contact between the card and a high voltage bus, and uses that high system voltage to tristate the output of a transceiver on the circuit board prior to second stage contact being made between the transceiver and the backplane data bus. Override circuitry for overriding the tristating effects of the isolating circuit are provided such that when the bias circuit which controls the transceiver output is properly powered, the bias circuit will control the transceiver output, and not the isolated circuit. Additional circuitry which isolates the circuit board so that a power fault on the board will not impact other boards on the backplane is also provided. The additional circuitry preferably includes a relative large resistor and a Schottky diode which are provided in parallel between a 5 V bus and the protection diodes of the transceiver.

20 Claims, 4 Drawing Sheets

5,568,060

CIRCUIT BOARD INSERTION CIRCUITRY FOR HIGH RELIABILITY BACKPLANES

BACKGROUND OF THE INVENTION

1. Field of the Invention

The present invention relates generally to card insertion circuitry for an open drain MOSFET backplane system. More particularly, the present invention relates to circuit board insertion circuitry useful with a staggered backplane connector, where the insertion circuitry guarantees that when a connection with the backplane data bus is initially established, the circuit board will present a tristated output to the data bus. The present invention has particular application to data communications and telecommunications switching systems, although it is not limited thereto. In addition, the present invention has particular application to a backplane using Gunning Transceiver Logic (GTL), although it may be applied to any open-drain logic, whether utilizing NMOS, or CMOS technology.

2. State of the Art

Present day data communications and telecommunications switching systems often rely upon a backplane based architecture, with a plurality of circuit boards or cards which are plugged in, or otherwise connected to the backplane. Open drain MOSFET transceivers such as are used in conjunction with Gunning Transceiver Logic (GTL) provide an attractive interface technique for such backplane based systems. An example of such an open drain MOSFET transceiver is seen prior art FIG. 1, where the transceiver chip 10 has a driving circuit including a bias or control circuit 15, and a transistor M1 which is provided with its drain coupled to the GTL data bus 20, its source coupled to ground, and its gate controlled by the control circuit 15. In a GTL system, the control circuit 15 typically has a 5 V and may have a 3.3 V supply, with the 5 V supply coming from a 5 V bus 40 which is coupled to the 5 V backplane voltage rail (not shown) at 45 by an electrical connector. The receiver of the transceiver is shown as an amplifier 30, although additional receiver circuitry would typically be included. The transceiver also includes protection circuit diodes 32, 34 which protect the MOSFETs in the receiver circuit from overvoltages typically caused by electrostatic discharges. Additional details regarding GTL circuits and transceivers may be found by reference to U.S. Pat. No. 5,023,488 to Gunning et al.

While GTL circuits are extremely useful in certain applications, in a high reliability backplane such as that required for a data communications or telecommunications switching system, two major drawbacks are present in the current state of the open drain art. First, the insertion of a card into an active backplane may cause errors on the data bus 15, as there is no guarantee in the art that open drain logic (transistor M1) will be OFF (i.e., nonconducting) upon insertion. Second, because the MOS circuits include the diode-based input protection circuitry (diodes 32,34), a card with a power fault may cause a system-wide failure. In particular, a short from power to ground on any card could cause the input protection diode D3 to become forward biased. Forward biasing of this diode would cause an appreciable drop in the "logic high" electrical level of the bus, leading to data loss in a bus scheme which calls for low voltage swings (such as the 1.2 V GTL bus). Furthermore, since appreciable current can flow through the diode D3, damage to the transceiver chip may occur.

SUMMARY OF THE INVENTION

It is therefore an object of the invention to provide card insertion circuitry which guarantees that when a card connection with a backplane data bus is initially established, the card will present a tristated output.

It is another object of the invention to provide insertion circuitry which isolates a circuit board so that a power fault on the circuit board will not impact other circuit boards on the backplane.

It is a further object of the invention to provide circuitry useful upon connecting a telecommunications circuit board with an open drain backplane bus.

It an additional object of the invention to provide insertion circuitry for use with a circuit board which utilizes a first connection to a high voltage rail to guarantee a tristated transceiver output when a connection is subsequently made to the backplane data bus.

In accord with the objects of the invention, the circuit board insertion circuitry of the invention is used in conjunction with a staggered (i.e., two or three stage) electrical connector. The insertion circuitry includes an isolated circuit which receives the high system voltage upon first stage contact between the card and a high voltage bus, and uses that high system voltage to tristate the output of a transceiver on the circuit board prior to second stage contact being made between the transceiver and the backplane data bus. Means for overriding the tristating effects of the isolating circuit are provided such that when the bias circuit which controls the transceiver output is properly powered, the bias circuit will control the transceiver output, and not the isolated circuit.

While many different isolated tristating circuits may be used, the preferred circuit comprises an isolating diode, an inverting buffer, and a MOS transistor which has its gate coupled to the inverting buffer, its source coupled to ground, and its drain coupled to the gate of the driving transistor of the transceiver. The isolating diode is provided to permit the voltage to the inverting buffer to quickly power to 5 V upon first stage contact and prior to second stage contact. If the inverting buffer is provided with a guaranteed low value input, upon being powered, it will provide a high output to the gate of the MOS transistor which will be turned ON. When the MOS transistor is ON, it pulls the gate of the driving transistor of the transceiver low, thereby turning the driving transistor OFF, thereby tristating the transceiver output prior to second stage contact being established (i.e., prior to a coupling of the transceiver and the data bus being made). At some time later, after contact has been made with the data bus, and after the entire board, including the bias circuit for the transceiver, has had sufficient time to power up, a logic control circuit (typically triggered by a microprocessor) is used as the tristate override means to provide a high input to the inverting buffer. A high input to the inverting buffer turns the MOS transistor OFF, thereby permitting the driving transistor of the transceiver to be controlled by the bias circuit for that driving transistor.

According to another aspect of the invention, additional circuitry is provided in order to isolate the card so that a power fault on the card will not impact other cards on the backplane. In particular, a relative large resistor (e.g., 10 KΩ) and an e.g., 0.2 V Schottky diode are provided in parallel between the 5 V bus and the protection diodes of the transceiver. The resistor is used to limit current flow from the data bus through the protection diode hand to the 5 V bus, should the 5 V bus be shorted low for any reason at the particular card. By limiting current flow, the integrity of the data bus is maintained, as it will not be pulled to a LOW state by the faulty card. In addition, in order to reduce any delays which might result from the RC time constants inherent in the system due to the resistor and any capacitors on the high voltage bus, a Schottky diode biased away from the 5 V bus is provided. Thus, when the 5 V bus is powered, essentially the entire 5 volts will be provided to the inverting buffer via the Schottky diode without delay.

Additional objects and advantages of the invention will become apparent to those skilled in the art upon reference to the detailed description taken in conjunction with the provided figures.

DETAILED DESCRIPTION OF THE PREFERRED EMBODIMENT

At the outset, and before turning to FIG. 2, it should be appreciated that the circuit board insertion circuitry of the invention is generally to be used in conjunction with a staggered (i.e., two or three stage) electrical connector such as is manufactured by Berg Electronics of Pennsylvania under part numbers 70236-103 and 70231-111 which are described in more detail hereinafter with respect to FIGS. 4a, 4b, 5a and 5b. With a staggered electrical connector, the forward blade(s) of the electrical connector will make contact with a common 5 V power supply rail and, if desired, a common 0 V (ground) rail, prior to the rear blades making contact with the data bus. Experimental data suggests that for a typical manual insertion, the time between the blade connection of the staggered connector to the 5 V rail and the blade connection to the data bus is between 1 ms and 500 ms. In accord with the invention, it is therefore necessary for the circuit board circuitry to tristate the output of the transceiver of the card in less than one millisecond after contact is made with the 5 V rail; and preferably in a time frame of several to tens of microseconds.

Figure 1:
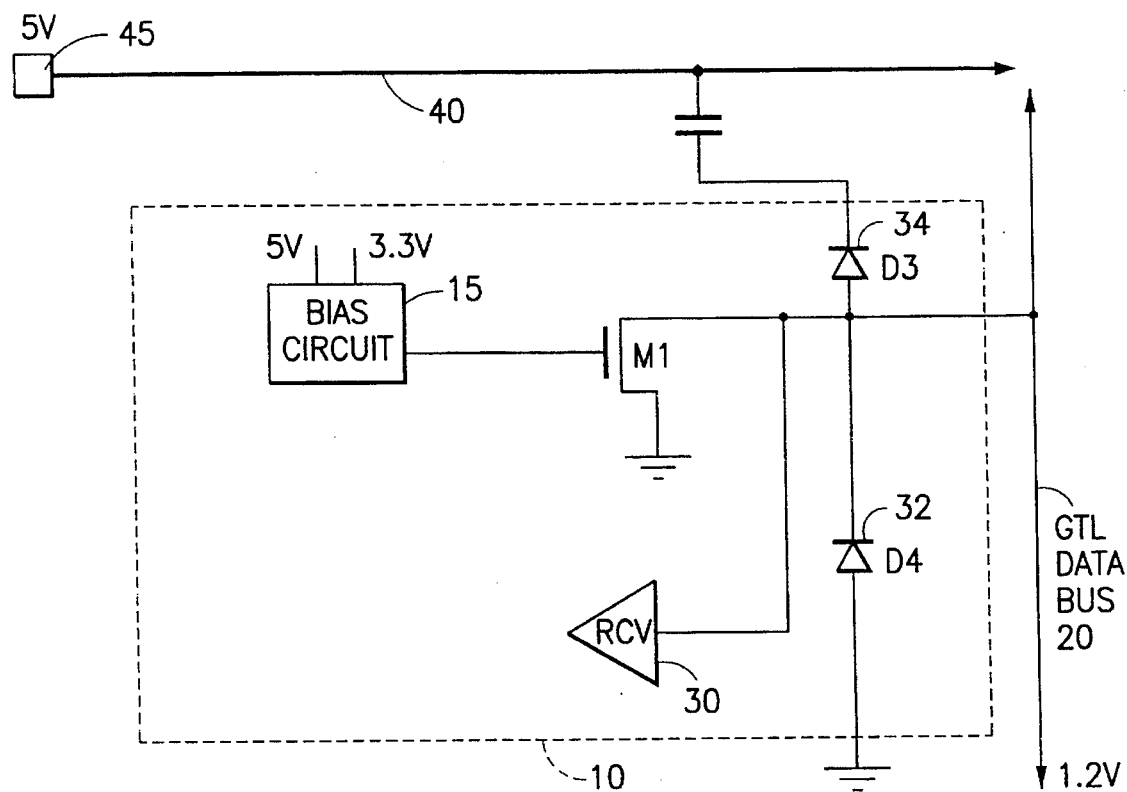
FIG. 1 is a partial block, partial circuit diagram of a prior art transceiver which is coupled to a GTL data bus.
Figure 2:
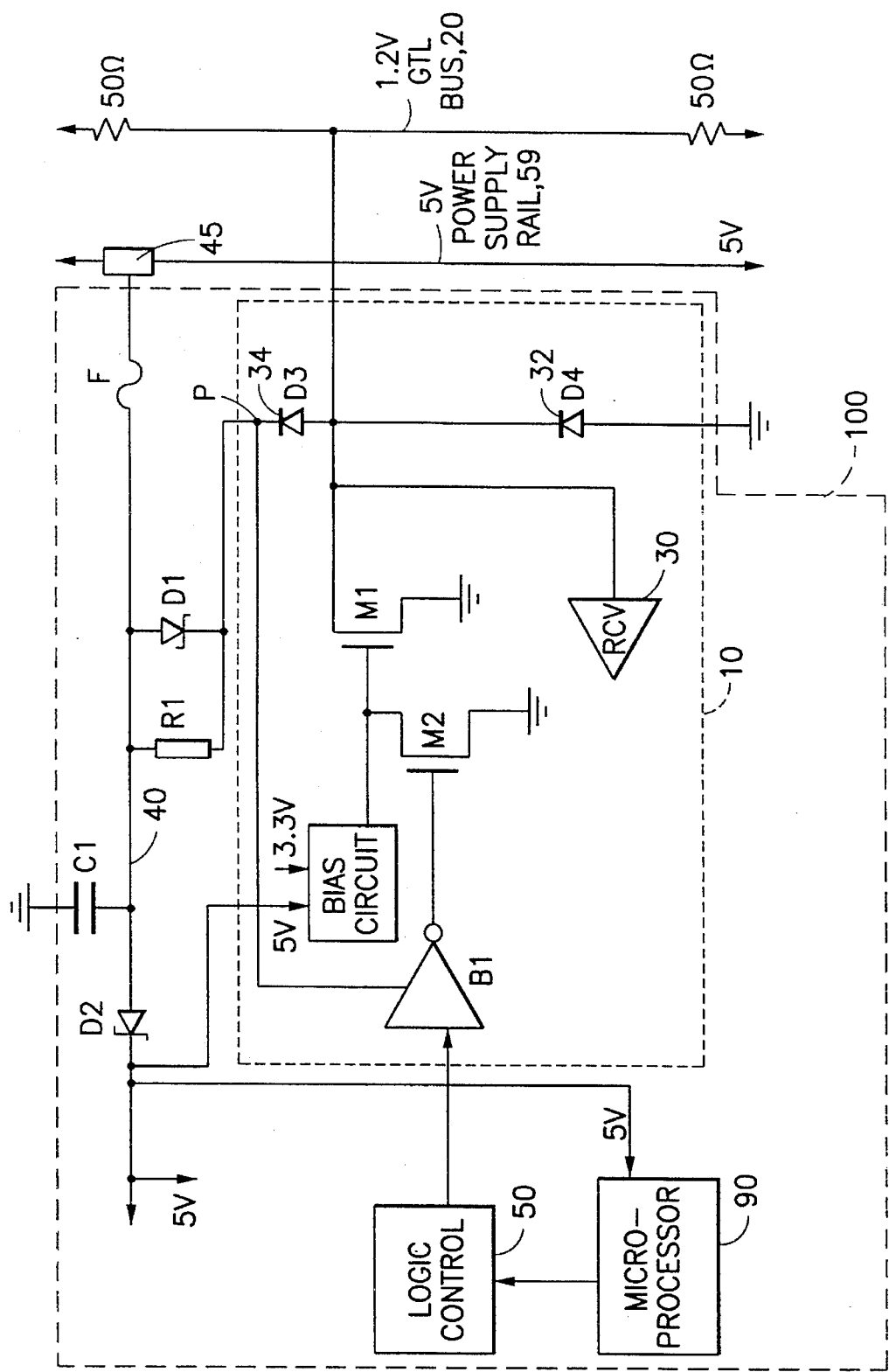
FIG. 2 is a partial block, partial circuit diagram of the circuit board insertion circuit of the invention.

Turning now to FIG. 2, and comparing FIG. 2 to FIG. 1 where like numerals indicate like elements, the preferred circuit board insertion circuitry of the invention is seen to include two Schottky diodes D1, D2, a resistor R1, a MOS transistor M2, a buffer inverter B1, and a logic control circuit 50. The circuit board insertion circuitry shown is in addition to the prior art circuitry which includes a capacitor C1, and a transceiver 10 (the transceiver including the transistor M1 and the bias or control circuit 15, the receiver 30, and the protection circuit diodes 32, 34). As discussed above with reference to FIG. 1, the transistor M1 of the transceiver has its drain coupled to the GTL data bus 20, its source coupled to ground, and its gate coupled to the bias circuit 15.

The insertion circuitry is preferably arranged with the transistor M2 and the buffer inverter B1 on the transceiver chip 10, and the remainder of the circuitry (resistor R1, diodes D1 and D2, and logic control 50) located on the circuit board 100, but off of the transceiver chip 10. Thus, the off-chip Schottky diode D2 is used as an isolating diode to separate the card interface circuitry for the transceiver 10 from other circuit board circuitry which requires the 5 V signal. The other Schottky diode D1, and resistor R1 are provided in parallel between the 5 V bus 40 and a boot power or power-up node or pin P of the transceiver chip 10, and their function is described below. The logic control circuit 50 is also typically off-chip, and provides a guaranteed logic low (0) output value upon power-up. Sometime after power up, (i.e., after the bias control circuit 15 is fully powered and able to control the driving transistor M1), the logic control circuit 50 changes its output to a logic high (1). The change in the value of the output may be accomplished under control of a microcontroller or microprocessor 90 on the circuit board 100, or may be accomplished independently via the use of an internal timer (not shown).

The on-chip elements of the insertion circuitry include the MOS transistor M2, and the buffer inverter B1. The inverting buffer B1 has its input coupled to the output of the off-chip logic control 50, its power control coupled to power-up pin (or node) P, and its output coupled to transistor M2. The transistor M2 is preferably arranged with its gate coupled to the output of the inverting buffer B1, its source coupled to ground, and its drain coupled to the gate of the driving transistor of the transceiver.

Figure 3:
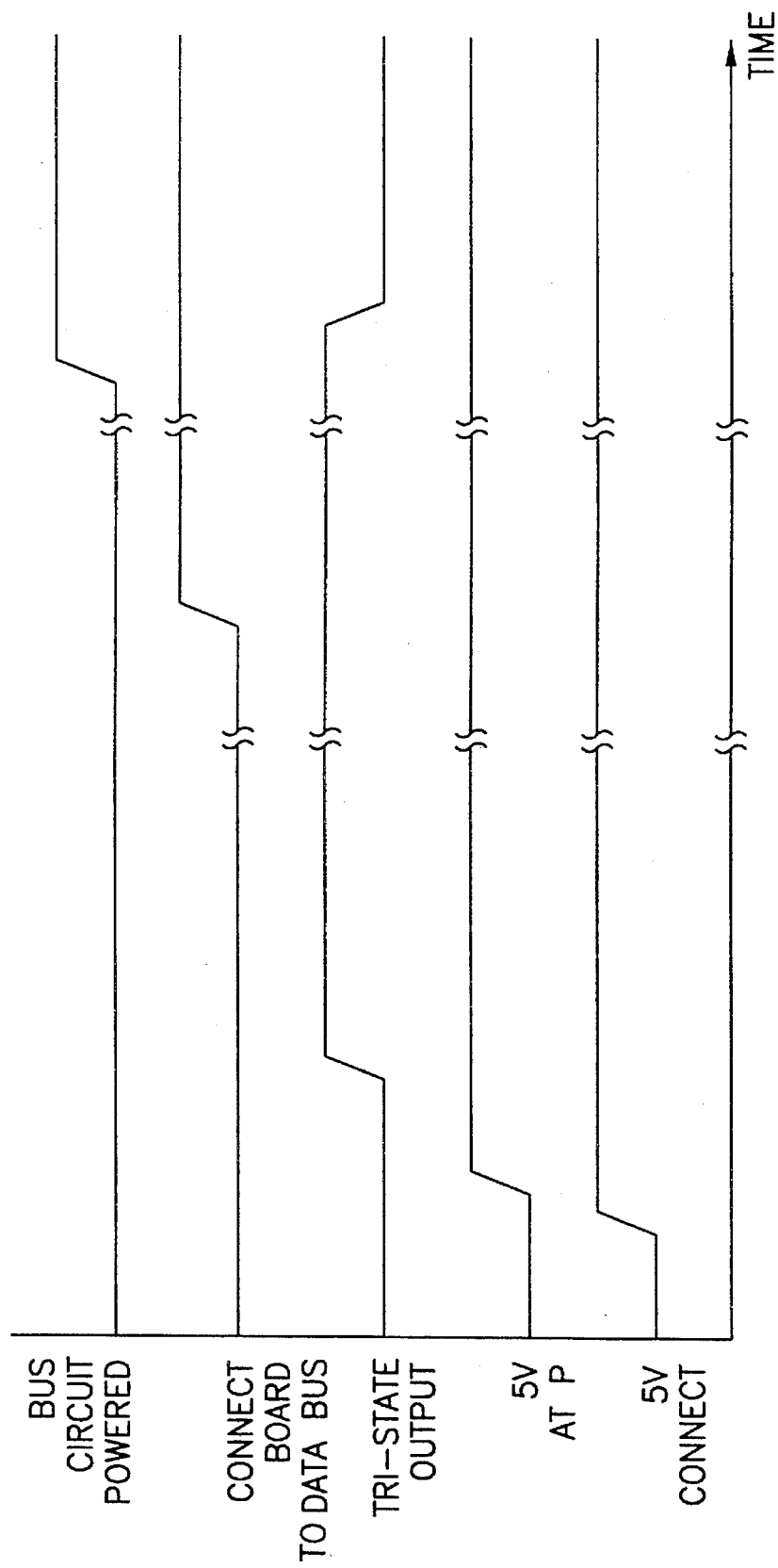
FIG. 3 is a timing diagram of voltages reached at various elements of the circuit board insertion circuit of FIG. 2.

The provided circuitry accomplishes the functions of tristating the output of the transceiver during power-up, and isolating the card so that a power fault on the card will not impact other cards on the backplane. In particular, the provision of the isolating diode D2 isolates the loads and capacitances of other circuits on the circuit board 100 which utilize the 5 V supply 40, and guarantees that almost immediately upon contact of the board connector and the backplane 5 V power supply rail 59 (contact indicated at 45), a substantially 5 V voltage will appear at boot power pin P (as seen with reference to FIG. 3). The 5 V voltage is applied to and immediately turns on the inverting buffer B1, which inverts the logic low signal it is receiving from the logic control circuit 50 and provides a logic high signal to the gate of the MOS transistor M2. The logic high signal provided to the gate of transistor M2 turns transistor M2 ON, thereby pulling the drain voltage of transistor M2 low. Since the drain of transistor M2 is coupled to the gate of driving transistor M1, when the drain of transistor M2 is pulled low, transistor M1 is quickly turned OFF; thereby effectively tristating the transceiver in a matter of microseconds, and, as seen in FIG. 3, prior to the connection of the card 100 to the GTL data bus. As previously mentioned, sometime after connection to the GTL data bus, and after the bias circuit 15 has had an opportunity to power up, the output of logic control 50 is changed; e.g., by a microprocessor 90 powered by the 5 V rail 40 at a point past isolating diode D2. As a result, a logic "0" is provided to the gate of transistor M2, which turns transistor M2 OFF. With transistor M2 OFF, the driving transistor M1 is controlled by the bias circuit 15. Thus, the bias circuit 15 is able to control whether transistor M1 is ON or OFF in accord with procedures of the prior art.

The function of isolating the card 100 so that a power fault on the card will not impact other cards on the backplane is accomplished by the resistor R1 and the Schottky diode D1 which are provided in parallel between the 5 V bus 40 and the protection diode 34 of the transceiver chip 10. In particular, the resistor R1 is used to limit current flow from the data bus 20 through the protection diode D3 and to the 5 V bus 40, should the 5 V bus be shorted low for any reason at the particular card. In order to limit current flow, resistor R1 is chosen to be relatively large, e.g., 10 KΩ. By limiting current flow, the integrity of the data bus is maintained, as it will not be pulled to a LOW state by the faulty card. In addition, in order to reduce any delays which might result from the RC time constants inherent in the system due to the resistor R1 and any capacitors (e.g., C1) or inherent capacitance on the high voltage bus, a preferably 0.2 V Schottky diode D1 biased away from the 5 V bus 40 is provided. Thus, when the 5 V bus 40 is powered, the 5 V will be provided to the inverting buffer via the Schottky diode without delay. Further, it will be appreciated that a fuse F is provided between the 5 V power supply rail 59 and capacitor C1 to protect the 5 V rail should the capacitor C1 short to ground.

Figure 4B:
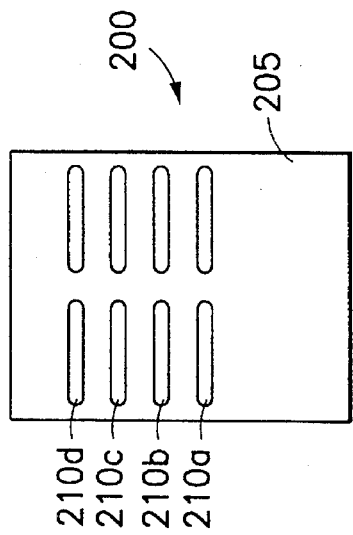
FIGS. 4a and 4b are respectively side and front elevational views of a first connector used in conjunction with the circuit board having the circuitry of the invention.
Figure 4A:
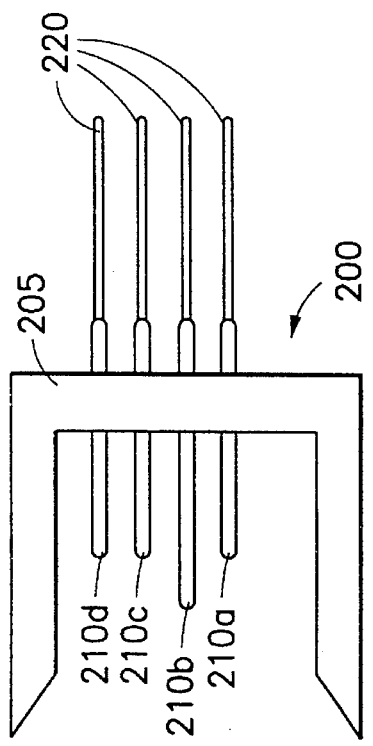

Turning now to FIGS. 4a, 4b, 5a, and 5b, a two stage connector system 200, 250 is seen. The connector system shown is manufactured by Berg Electronics of Pennsylvania under part numbers 70236-103 and 70231-111; however, similar systems are available from other vendors such as AMP, Inc. As seen in FIGS. 4a and 4b, a first connector 200 of the system which is preferably provided on circuit board 100 (see FIG. 2) is shown. The first connector 200 has a housing 205, a plurality of blades 210a, 210b, 210c, 210d . . ., and a plurality of contact pins 220 which are coupled to the blades 210. The contact pins 220, which may be bent or straight, are typically soldered directly to the circuit board 100. The blades 210 which are held in the housing 205 are used to contact the second connector 250. In accord with the invention, blade 210b is longer than the other blades 210a, 210c, and 210d; i.e., first connector 200 is a staggered connector. Thus, as described below, blade 210b will make contact (at 45—see FIG. 2) with a blade receptacle of the second connector before the other blades make a similar contact.

Figure 5B:
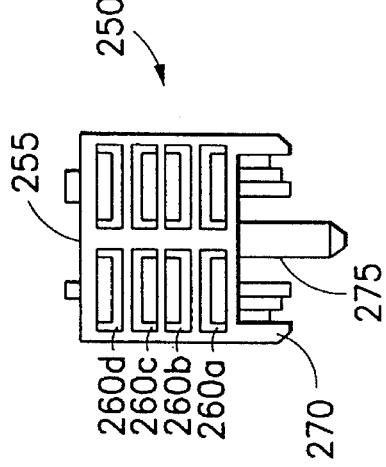
FIGS. 5a and 5b are respectively side and front elevational views of a second connector used on a backplane, and which mates with the first connector of FIGS. 4a and 4b.
Figure 5A:
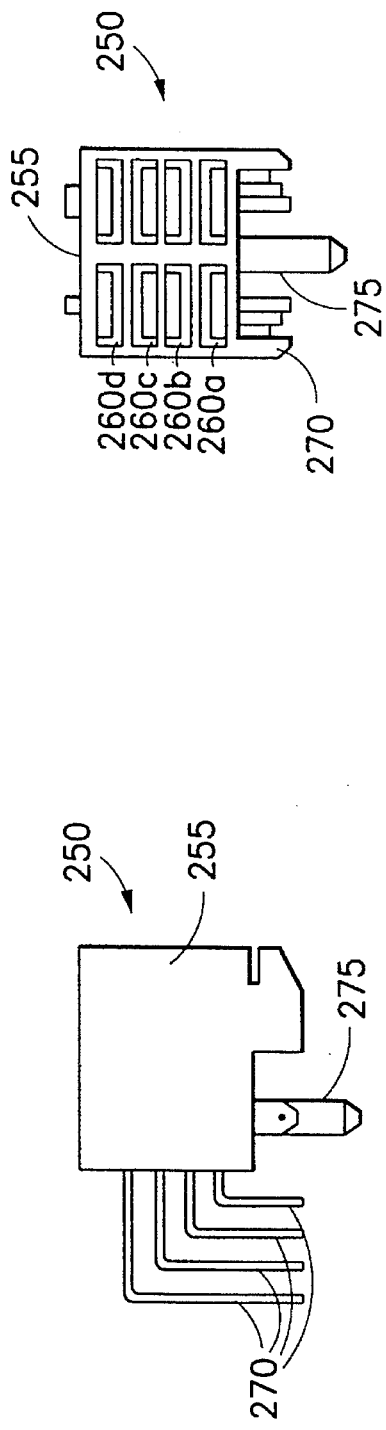

The second connector 250 seen in FIGS. 5a and 5b includes a housing 255, a plurality of blade receptacles 260a, 260b, 260c, and 260d, and a plurality of contact pins 270 which are coupled to the blade receptacles 260. The contact pins 270 may be straight or bent and are typically soldered directly to the backplane (not shown). A centering pin 275 is also provided. With the first and second connectors as provided, as the blades 210 of the first connector 200 are plugged into the blade receptacles 260 of the second connector 250 (with housing 205 extending around housing 255), contact is first made between blade 210b and blade receptacle 260b, followed by contact between blades 210a, 210c, and 210d with blade receptacles 260a, 260c, and 260d. In particular, by way of example, and with reference to FIGS. 2, 4a, 4b, 5a, and 5b, if the blade receptacle 260b is coupled to the 5 V high voltage rail 59 of the backplane, blade receptacle 260a is coupled to the GTL data bus 20, blade 210b is coupled to bus 40 of card 100, and blade 210a is coupled to the drain of transistor M1, the 5 V connection at 45 will be made prior to the connection between transistor M1 and the GTL data bus 20 (and other connections) being made.

It should be appreciated that the connectors 200 and 250 can be reversed such that connector 250 is used on the circuit board, and connector 200 is used on the backplane. Also, other connector systems can be utilized. For example, single unit connectors having blades which contact traces (buses) on the circuit board of the backplane directly can be utilized instead of a two piece connector system.

There has been described and illustrated herein circuit board insertion circuitry for an open drain MOSFET backplane system. While particular circuitry has been shown, it will be appreciated that other circuitry could be utilized to provide similar results. Thus, for example, instead of using an inverter B1 to invert a guaranteed low signal from the logic control in order to turn transistor M2 ON, the 5 V signal received at pin P could be applied to the gate of transistor M2. The tristate override circuit could then take the form of a relay located between pin P and the gate of transistor M2 which would open the circuit when toggled at a later time. Also, while the transceiver was described as utilizing n-channel MOS transistors, it will be appreciated that p-channel could also be utilized. Further, if desired, the inverting buffer could be eliminated, and the 5 V signal at pin P could be used to cause the logic control 50 to provide a voltage to transistor M2 which would turn M2 ON. In addition, it will be appreciated that while a diode and resistor were provided for purposes of isolating the entire card from other cards should there be a fault, other isolation circuitry could be utilized. For example, isolation may be carried out with just the resistor, or just the diode. Finally, it should be appreciated while a particular staggered connector arrangement was disclosed for use with the insertion circuitry, other staggered connector arrangements, utilizing single or double connector arrangements could be utilized. Therefore, it will be apparent to those skilled in the art that other changes and modifications may be made to the invention as described in the specification without departing from the spirit and scope of the invention as so claimed.

We claim:

1. Apparatus on a circuit board for temporarily controlling the output of a transceiver on the circuit board which is otherwise controlled by a bias circuit and which is to be coupled to an open drain data bus, the apparatus being used in conjunction with a staggered electrical connector which first connects the circuit board to a high system voltage rail and then to the open drain data bus, said apparatus comprising:

a) an isolated circuit means on the circuit board, with the isolated circuit means being coupled to the high system voltage rail upon connection of the circuit board to the high system voltage rail, and also being coupled to the transceiver, said isolated circuit means for controlling the output of the transceiver by quickly receiving a high system voltage from the high system voltage rail upon connection of the circuit board to the high system voltage rail, and by using said high system voltage in order to tristate the output of the transceiver within at most one millisecond after the staggered electrical connector connects the circuit board to the high system voltage rail, and prior to the staggered electrical connector being connecting to the data bus; and b) tristate override means for turning off control of the transceiver by said isolation circuit means after the electrical connector connects the transceiver on the circuit board to the open drain data bus, and after the bias circuit is fully powered so that it can properly control the transceiver output.

2. An apparatus according to claim 1, where the transceiver comprises a first MOS transistor having a drain coupled to the data bus, a gate coupled to the bias circuit, and a source coupled to ground, wherein:

said isolated circuit means comprises a second MOS transistor means coupled to the gate of the first MOS transistor, said second MOS transistor means for temporarily turning said first MOS transistor OFF.

3. An apparatus according to claim 2, wherein:

said isolated circuit means further comprises a buffer means which turns on upon receiving said high system voltage, said buffer means for providing a signal of a first value to a gate of said second MOS transistor means.

4. An apparatus according to claim 3, wherein:

said second MOS transistor means has a source coupled to ground and a drain coupled to the gate of the first MOS transistor, and said buffer means is an inverting buffer which receives a guaranteed low input upon power up, and provides a high signal upon power up to said gate of said second MOS transistor means.

5. An apparatus according to claim 2, wherein:

said tristate override means comprises means for preventing said second MOS transistor means from turning the first MOS transistor OFF after the electrical connector connects the transceiver on the circuit board to the open drain data bus, and after the bias circuit is fully powered so that it can properly control the transceiver output.

6. An apparatus according to claim 3, wherein:

said tristate override means comprises means for preventing said second MOS transistor means from turning the first MOS transistor OFF after the electrical connector connects the transceiver on the circuit board to the open drain data bus, and after the bias circuit is fully powered so that it can properly control the transceiver output.

7. An apparatus according to claim 6, wherein:

said means for preventing comprises a logic control means coupled to said buffer means, said logic control means for causing said buffer means to change its output to a signal of a second value different than said first value.

8. An apparatus according to claim 1, further comprising:

c) a circuit board bus which is coupled by the staggered electrical connector to the high system voltage rail, wherein said isolated circuit means comprises a diode which is coupled in series in said circuit board bus, such that all connections between said circuit board bus and elements of the circuit board requiring power from said circuit board bus other than said isolated circuit means are located at locations along said circuit board bus which are other than between said diode and said staggered electrical connector.

9. An apparatus according to claim 4, further comprising:

c) a circuit board bus which is coupled by the staggered electrical connector to the high system voltage rail, wherein said isolated circuit means further comprises a diode which is coupled in series in said circuit board bus, such that all connections between said circuit board bus and elements of the circuit board requiring power from said circuit board bus other than said isolated circuit means are located at locations along said circuit board bus which are other than between said diode and said staggered electrical connector.

10. An apparatus according to claim 1, further comprising:

c) a circuit board bus which is coupled by the staggered electrical connector to the high system voltage rail; and d) circuit means for preventing a large current flow from the data bus through to said circuit board bus should a failure on the circuit board cause said circuit board bus to be pulled to a low voltage, which large current flow would pull the data bus down to a low voltage.

11. An apparatus according to claim 10, wherein:

said circuit means comprises a resistor coupled between said circuit board bus and the transceiver.

12. An apparatus according to claim 11, wherein:

said circuit means further comprises a diode coupled in parallel with said resistor.

13. An apparatus according to claim 12, wherein:

said diode is a Schottky diode.

14. An apparatus according to claim 9, further comprising:

d) circuit means for preventing a large current flow from the data bus through to said circuit board bus should a failure on the circuit board cause said circuit board bus to be pulled to a low voltage, which large current flow would pull the data bus down to a low voltage.

15. An apparatus according to claim 14, wherein:

said circuit means comprises a resistor coupled between said circuit board bus and the transceiver.

16. An apparatus according to claim 15, wherein:

said circuit means further comprises a second diode coupled in parallel with said resistor.

17. An apparatus according to claim 16, wherein:

said second diode is a Schottky diode.

18. An apparatus on a circuit board which is to be used in conjunction with a staggered electrical connector which first connects the circuit board to a high system voltage rail and then to an open drain data bus, said apparatus comprising:

a) a transceiver including a driving MOS transistor which is coupled to the open drain data bus, a bias circuit means for controlling said driving MOS transistor, and a receiver coupled to the open drain data bus;

b) an isolated circuit means which is coupled to the high system voltage rail upon connection of the circuit board to the high system voltage rail, and also being coupled to said transceiver, said isolated circuit means for temporarily controlling an output of said transceiver by quickly receiving a high system voltage from the high system voltage rail upon connection of the circuit board to the high system voltage rail, and by using said high system voltage in order to tristate the output of said transceiver within at most one millisecond after the staggered electrical connector connects the circuit board to the high system voltage rail, and prior to the staggered electrical connector being connecting to the data bus; and c) tristate override means for turning off control of said transceiver by said isolation circuit means after the electrical connector connects said transceiver on the circuit board to the open drain data bus, and after the bias circuit is fully powered so that it can properly control said transceiver output.

19. An apparatus according to claim 18, wherein:

said driving MOS transistor has a drain coupled to the data bus, a gate coupled to said bias circuit means, and a source coupled to ground, and said isolated circuit means comprises a buffer means and a second MOS transistor, said buffer means for turning ON upon receiving said high system voltage and for providing an output to a gate of said second MOS transistor, said second MOS transistor having a drain coupled to said gate of said driving MOS transistor and a source coupled to ground, wherein said second MOS transistor temporarily turns said driving MOS transistor OFF upon receiving said output of said buffer means when said buffer means is turned ON.

20. An apparatus according to claim 19, wherein:

said tristate override means comprises means for preventing said second MOS transistor from turning said driving MOS transistor OFF after the electrical connector connects said transceiver to the open drain data bus, and after said bias circuit is fully powered so that it can properly control said transceiver output.

* * * * *